(12) United States Patent
Hara et al.

(10) Patent No.: US 10,984,938 B2
(45) Date of Patent: Apr. 20, 2021

(54) MAGNETORESISTANCE EFFECT DEVICE

(71) Applicant: TDK CORPORATION, Tokyo (JP)

(72) Inventors: Shinji Hara, Tokyo (JP); Akimasa Kaizu, Tokyo (JP)

(73) Assignee: TDK CORPORATION, Tokyo (JP)

( * ) Notice: Subject to any disclaimer, the term of this patent is extended or adjusted under 35 U.S.C. 154(b) by 38 days.

(21) Appl. No.: 16/235,089

(22) Filed: Dec. 28, 2018

(65) Prior Publication Data

US 2019/0228894 A1    Jul. 25, 2019

(30) Foreign Application Priority Data

Jan. 19, 2018 (JP) .............................. JP2018-007710

(51) Int. Cl.
| | |
|---|---|
| *H01F 10/32* | (2006.01) |
| *H01L 43/02* | (2006.01) |
| *H01F 41/32* | (2006.01) |
| *H01L 43/12* | (2006.01) |
| *H03H 11/16* | (2006.01) |
| *H03F 15/00* | (2006.01) |
| *H01L 43/10* | (2006.01) |
| *H03H 11/04* | (2006.01) |
| *H03H 2/00* | (2006.01) |

(52) U.S. Cl.
CPC ......... *H01F 10/329* (2013.01); *H01F 10/324* (2013.01); *H01F 10/3254* (2013.01); *H01F 10/3268* (2013.01); *H01F 10/3286* (2013.01); *H01F 41/32* (2013.01); *H01L 43/02* (2013.01); *H01L 43/10* (2013.01); *H01L 43/12* (2013.01); *H03F 15/00* (2013.01); *H03H 2/00* (2013.01); *H03H 11/04* (2013.01); *H03H 11/16* (2013.01)

(58) Field of Classification Search
CPC ........ H01L 43/02; G01R 33/09; G01R 33/093
USPC ....................................... 257/421; 360/321
See application file for complete search history.

(56) References Cited

U.S. PATENT DOCUMENTS

| | | | |
|---|---|---|---|
| 8,493,694 B2 | 7/2013 | Zheng et al. | |
| 2004/0109263 A1* | 6/2004 | Suda ................ | B82Y 10/00 360/322 |

(Continued)

FOREIGN PATENT DOCUMENTS

| | | |
|---|---|---|
| JP | 5852856 B | 2/2016 |
| JP | 2017063397 A | 3/2017 |

OTHER PUBLICATIONS

Tulapurkar et al., "Spin-torque diode effect in magnetic tunnel junctions;" Nature, vol. 438, No. 7066, pp. 339-342, Nov. 17, 2005.

*Primary Examiner* — David Vu
*Assistant Examiner* — Brandon C Fox
(74) *Attorney, Agent, or Firm* — Oliff PLC

(57) ABSTRACT

The magnetoresistance effect device includes: a magnetoresistance effect element that includes a first magnetization free layer, a magnetization fixed layer or a second magnetization free layer, and a spacer layer interposed between the first magnetization free layer and the magnetization fixed layer or the second magnetization free layer; and a magnetic material part that applies a magnetic field to the magnetoresistance effect element, wherein the magnetic material part is arranged to surround an outer circumference of the magnetoresistance effect element in a plan view in a stacking direction L of the magnetoresistance effect element.

7 Claims, 10 Drawing Sheets

(56) References Cited

U.S. PATENT DOCUMENTS

| | | | |
|---|---|---|---|
| 2008/0080097 A1* | 4/2008 | Nagasaka | H01F 10/3272 360/314 |
| 2011/0233697 A1* | 9/2011 | Kajiyama | H01L 27/228 257/421 |
| 2012/0002330 A1* | 1/2012 | Matsuzawa | B82Y 25/00 360/313 |
| 2016/0277000 A1 | 9/2016 | Shibata et al. | |
| 2017/0244377 A1 | 8/2017 | Yamane et al. | |

* cited by examiner

US 10,984,938 B2

MAGNETORESISTANCE EFFECT DEVICE

BACKGROUND

The disclosure relates to a magnetoresistance effect device.

Priority is claimed on Japanese Patent Application No. 2018-007710, filed on Jan. 19, 2018, the content of which is incorporated herein by reference.

With recent enhancement in functionality of mobile communication terminals such as mobile phones, an increase in communication speed of radio communications has progressed. Since a communication speed is proportional to a used frequency bandwidth, a frequency band required for communications has widened and the number of high-frequency filters required for a mobile communication terminal has increased accordingly. Recently, research has been actively carried out in the field of spintronics of which application to new high-frequency components is expected. A ferromagnetic resonance phenomenon using a magnetoresistance effect element has attracted attention (see Nature, Vol. 438, No. 7066, pp. 339-342, 17 Nov. 2005).

Ferromagnetic resonance can be caused in magnetization of a magnetization free layer included in a magnetoresistance effect element, for example, by causing an alternating current to flow in the magnetoresistance effect element and applying a static magnetic field thereto using a magnetic field application mechanism at the same time. At this time, a resistance value of the magnetoresistance effect element fluctuates periodically at a frequency corresponding to a ferromagnetic resonance frequency. The ferromagnetic resonance frequency varies depending on the intensity of the static magnetic field applied to the magnetoresistance effect element, and the resonance frequency thereof is generally in a high frequency band of several to several tens of GHz (see Japanese Unexamined Patent Application, First Publication No. 2017-63397).

SUMMARY

In a magnetoresistance effect device according to the related art constituting a magnetic head or the like, magnetic material parts of two bias portions that apply a magnetic field to a magnetoresistance effect element are generally arranged with the magnetoresistance effect element interposed therebetween (see Japanese Unexamined Patent Application, First Publication No. 2017-63397 and Japanese Patent No. 5852856). In such an arrangement, it has been found that a deviation of a distribution of a magnetic field in a lamination plane direction in the magnetoresistance effect element increases, thus a magnetization distribution in a magnetization free layer is deviated, domains are formed, behavior of magnetization (for example, a ferromagnetic resonance frequency) differs depending on the domains, and, for example, a Q value of resonance characteristics decreases.

The disclosure is made in consideration of the above-mentioned circumstances and provides a magnetoresistance effect device that can more uniformly apply a magnetic field in a lamination plane direction to a magnetoresistance effect element.

The disclosure provides the following means to achieve the above-mentioned objective.

(1) A magnetoresistance effect device according to an aspect of the disclosure includes: a magnetoresistance effect element that includes a first magnetization free layer, a magnetization fixed layer or a second magnetization free layer, and a spacer layer interposed between the first magnetization free layer and the magnetization fixed layer or the second magnetization free layer; and a magnetic material part configured to apply a magnetic field to the magnetoresistance effect element, wherein the magnetic material part is arranged to surround an outer circumference of the magnetoresistance effect element in a plan view in a stacking direction of the magnetoresistance effect element.

DETAILED DESCRIPTION

Figure 1A:
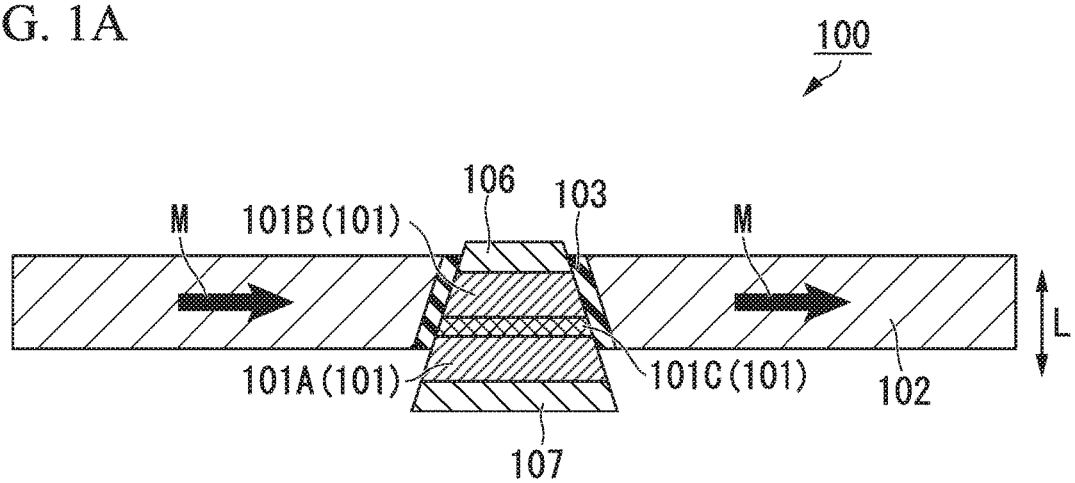
FIG. 1A is a sectional view schematically illustrating a configuration of a magnetoresistance effect device according to a first embodiment of the disclosure.

Hereinafter, the disclosure will be described in detail with reference to the accompanying drawings. In the drawings which are used in the following description, feature parts may be enlarged for the purpose of convenience and dimensional ratios between elements or the like may be different from actual values. Materials, dimensions, and the like which are described in the following description are examples, and the invention is not limited thereto and can be appropriately modified within a range in which advantages of the disclosure can be achieved. An element according to the disclosure may further include another layer within a range in which advantages of the disclosure can be achieved.

In the magnetoresistance effect device according to the disclosure, since a magnetic material part is arranged to surround the outer circumference of a magnetoresistance effect element in a plan view in a stacking direction of a magnetoresistance effect element, a magnetic field in a lamination plane direction which is applied to the magnetoresistance effect element is made uniform.

First Embodiment (Configuration of Magnetoresistance Effect Device)

Figure 1B:
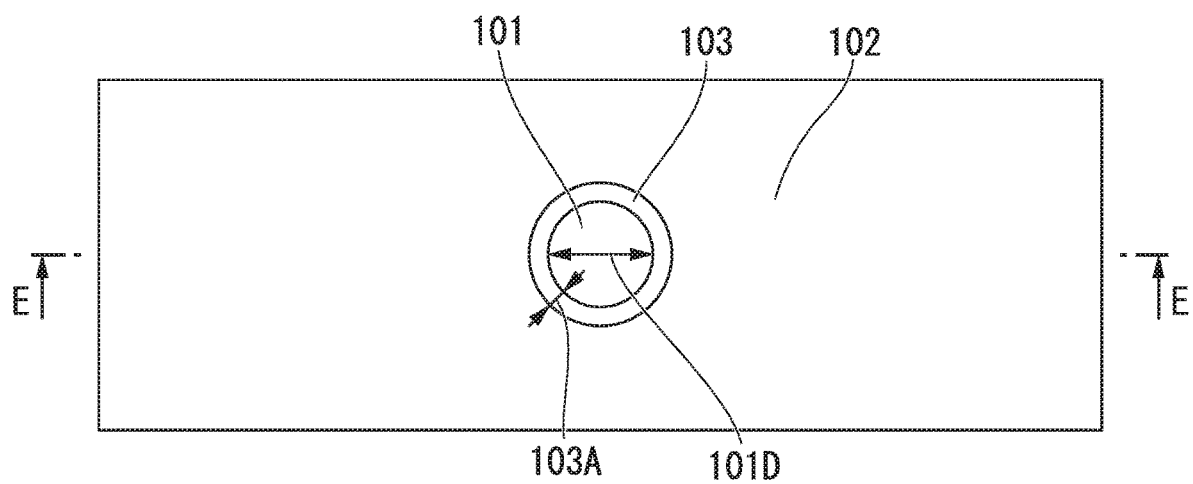
FIG. 1B is a plan view schematically illustrating the configuration of the magnetoresistance effect device according to the first embodiment of the disclosure.

FIGS. 1A and 1B are sectional views schematically illustrating a configuration of a magnetoresistance effect device 100 according to a first embodiment of the disclosure. FIG. 1A illustrates a sectional surface along line E-E' in FIG. 1B and FIG. 1B illustrates a plane when seen from one end in a stacking direction L. The magnetoresistance effect device 100 includes at least a magnetoresistance effect element (MR element) 101 and a magnetic material part 102 that applies a magnetic field to the magnetoresistance effect element 101.

<Magnetoresistance Effect Element>

The magnetoresistance effect element 101 includes a first layer (a magnetization fixed layer) 101A, a second layer (a magnetization free layer) 101B, and a spacer layer 101C. The spacer layer 101C is disposed between the magnetization fixed layer 101A and the magnetization free layer 101B. It is more difficult to for a magnetization of the magnetization fixed layer 101A to change than for a magnetization of the magnetization free layer 101B and it is fixed in one direction under a predetermined magnetic field environment. The magnetoresistance effect element 101 functions by changing the magnetization direction of the magnetization fixed layer 101A relative to the magnetization direction of the magnetization free layer 101B.

In the following description, it is assumed that the first layer is a magnetization fixed layer and the second layer is a magnetization free layer as described above. On the other hand, one of the first layer and the second layer does not have to be a magnetization fixed layer and both the first layer and the second layer may be magnetization free layers. In this case, one of the first layer and the second layer is a magnetization free layer and the other is a second magnetization free layer. The magnetization directions of the first layer and the second layer can change relative to each other. For example, a magnetoresistance effect element in which two magnetization free layers are magnetically coupled to each other with a spacer layer interposed therebetween may be employed. More specifically, two magnetization free layers may be magnetically coupled to each other with a spacer layer interposed therebetween such that the magnetization directions of the two magnetization free layers are anti-parallel to each other in a state in which an external magnetic field is not applied thereto.

The magnetization fixed layer 101A is formed of a ferromagnetic material. The magnetization fixed layer 101A is preferably formed of a high spin-polarization material such as Fe, Co, Ni, an alloy of Ni and Fe, an alloy of Fe and Co, or an alloy of Fe, Co, and B. A rate of magnetoresistance change of the magnetoresistance effect element 101 increases by using such a material. The magnetization fixed layer 101A may be formed of a Heusler alloy. The thickness of the magnetization fixed layer 101A preferably ranges from 1 nm to 20 nm.

A method of fixing the magnetization of the magnetization fixed layer 101A is not particularly limited. For example, an antiferromagnetic layer may be added to be in contact with the magnetization fixed layer 101A in order to fix the magnetization of the magnetization fixed layer 101A. The magnetization of the magnetization fixed layer 101A may be fixed using magnetic anisotropy resulting from a crystal structure, a shape, or the like. FeO, CoO, NiO, $CuFeS_2$, IrMn, FeMn, PtMn, Cr, Mn, or the like can be used for the antiferromagnetic layer The magnetization free layer 101B is formed of a ferromagnetic material of which a magnetization direction can be changed by an external magnetic field or spin-polarized electrons.

The magnetization free layer 101B can utilize CoFe, CoFeB, CoFeSi, CoMnGe, CoMnSi, CoMnAl, or the like as a material thereof when an axis of easy magnetization is provided in an in-plane direction perpendicular to a stacking direction in which the magnetization free layer 101B is stacked, and can utilize Co, a CoCr-based alloy, a Co multilayered film, a CoCrPt-based alloy, an FePt-based alloy, a SmCo-based alloy or a TbFeCo alloy including a rare earth metal, or the like as a material thereof when the axis of easy magnetization is provided in the stacking direction of the magnetization free layer 101B. The magnetization free layer 101B may be formed of a Heusler alloy.

The thickness of the magnetization free layer 101B preferably ranges from about 0.5 nm to 20 nm. A high spin-polarization material may be interposed between the magnetization free layer 101B and the spacer layer 101C. It is possible to obtain a high rate of magnetoresistance change by adding such a high spin-polarization material.

Examples of the high spin-polarization material include a CoFe alloy and a CoFeB alloy. The thickness of the CoFe alloy or the CoFeB alloy preferably ranges from about 0.2 nm to 1.0 nm.

It is preferable that a nonmagnetic material be used for the spacer layer 101C. The spacer layer 101C includes a layer formed of a conductor, an insulator, or a semiconductor or a layer in which a current-carrying point formed of a conductor is included in an insulator.

For example, the magnetoresistance effect element 101 serves as a tunneling magnetoresistance (TMR) element when the spacer layer 101C is formed of an insulator, and serves as a giant magnetoresistance (GMR) element when the spacer layer 101C is formed of a metal.

When an insulating material is used for the spacer layer 101C, an insulating material such as $Al_2O_3$ or MgO can be used. A high rate of magnetoresistance change can be obtained by adjusting the thickness of the spacer layer 101C such that a coherent tunneling effect is exhibited between the magnetization fixed layer 101A and the magnetization free layer 101B. In order to efficiently utilize a TMR effect, the thickness of the spacer layer 101C preferably ranges from 0.5 nm to 3.0 nm.

When the spacer layer 101C is formed of a conductive material, a conductive material such as Cu, Ag, Au, or Ru can be used. In order to efficiently utilize a GMR effect, the thickness of the spacer layer 101C preferably ranges from about 0.5 nm to 3.0 nm.

When the spacer layer 101C is formed of a semiconductor material, a material such as ZnO, $In_2O_3$, $SnO_2$, ITO, $GaO_x$, or $GeO_x$ can be used. In this case, the thickness of the spacer layer 101C preferably ranges from about 1.0 nm to 4.0 nm.

When a layer in which a current-carrying point formed of a conductor is included in an insulator is used as the spacer layer 101C, a structure in which a current-carrying point formed of a conductor such as CoFe, CoFeB, CoFeSi, CoMnGe, CoMnSi, CoMnAl, Fe, Co, Au, Cu, Al, or Mg is included in an insulator formed of $Al_2O_3$ or MgO can be preferably employed. In this case, the thickness of the spacer layer 101C preferably ranges from 0.5 nm to 2.0 nm.

<Magnetic Material Part>

The magnetic material part 102 is formed of a magnetic material and is arranged to surround the outer circumference of the magnetoresistance effect element 101 in a plan view in the stacking direction L of the magnetoresistance effect element. The position of the magnetic material part 102 in the stacking direction L is not particularly limited, and the magnetic material part 102 is preferably arranged to surround the outer circumference of the magnetization free layer 101B.

The magnetic material part 102 has a magnetization M having a component in a lamination plane direction of the magnetoresistance effect element. Accordingly, the magnetic material part 102 applies a magnetic field having a component in the lamination plane direction of the magnetoresistance effect element to the magnetoresistance effect element 101. The magnetic material part 102 applies a magnetic field in a fixed direction to the magnetoresistance effect element 101. It is preferable that the magnetic material part 102 be magnetized actually in one direction. It is also preferable that the axis of easy magnetization of the magnetic material part 102 be in a direction parallel to the lamination plane direction of the magnetoresistance effect element.

Figure 2:
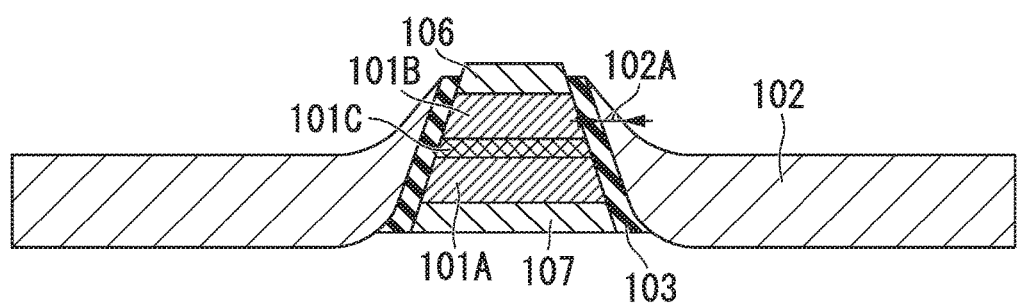
FIG. 2 is a diagram illustrating a configuration around a magnetic material part when the magnetic material part has a shape different from that illustrated in FIG. 1.

The magnetic material part 102 illustrated in FIG. 1A extends from the surroundings of the magnetization free layer 101B in a direction which is substantially perpendicular to the stacking direction L, but may extend in a different direction. FIG. 2 is a diagram illustrating an example in which the magnetic material part 102 extends in a different direction. For example, as illustrated in FIG. 2, the magnetic material part 102 may extend to be inclined in the stacking direction L as it separates from the surroundings of the magnetization free layer 101B. In this case, at least a part of the magnetic material part 102 preferably remains in the surroundings of the magnetization free layer 101B (in a direction substantially perpendicular to the stacking direction L), and the width 102A of the remaining magnetic material part is preferably equal to or greater than 1.0 nm.

For example, a hard magnetic material (a magnet) can be used as a magnetic material forming the magnetic material part 102, and a CoPt alloy, a FePt alloy, a CoCrPt alloy or the like can be used as a material thereof. Another example of the magnetic material forming the magnetic material part 102 will be described later in another embodiment.

An insulation part (an insulating layer) 103 is provided between the magnetoresistance effect element 101 and the magnetic material part 102. For example, silicon oxide, aluminum oxide, silicon nitride, aluminum nitride, tantalum oxide, titanium oxide, a magnesium oxide, or niobium oxide can be used as a material of the insulation part 103.

In the plan view in the stacking direction L, the width 103A of the insulation part 103 is preferably equal to or greater than 0.5 nm, more preferably ranges from 1.0 nm to 20.0 nm, and still more preferably ranges from 1.5 nm to 10.0 nm. In the plan view in the stacking direction L, a ratio of the width 103A of the insulation part in an arbitrary direction passing through the center of gravity of the magnetoresistance effect element 101 to the width (a diameter herein) 101D in the same direction is preferably equal to or greater than 0.1%, more preferable ranges from 0.2% to 50%, and still more preferable ranges from 0.3% to 25%. When the ratio is less than 0.1%, the magnetoresistance effect element 101 and the magnetic material part 102 may be electrically connected to each other, which is not preferable.

In the plan view in the stacking direction L, the magnetic material part 102 is arranged to surround the outer circumference of the magnetoresistance effect element 101. A part of the outer circumference of the magnetoresistance effect element 101 surrounded by the magnetic material part 102 is preferably larger, and the entire circumference of the magnetoresistance effect element 101 in the plan view is preferably surrounded by the magnetic material part 102. FIG. 1B illustrates an example in which the magnetic material part 102 is arranged to surround an entire circumference of the magnetoresistance effect element 101 in the plan view.

From the viewpoint of enhancement in isotropy of the magnetic material part 102 with respect to the magnetoresistance effect element 101, it is preferable that the width 103A of the insulation part be provided over the entire circumference of the magnetoresistance effect element 101.

In order to enhance current-carrying ability in the magnetoresistance effect element 101, it is preferable that an electrode be disposed at both ends of the magnetoresistance effect element 101. In the following description, the electrode disposed at the top end of the magnetoresistance effect element 101 in the stacking direction is referred to as an upper electrode 106, and the electrode disposed at the bottom end thereof is referred to as a lower electrode 107. For example, a material having conductivity such as Ta, Cu, Au, AuCu, Ru, or Al can be used as the material of the upper electrode 106 and the lower electrode 107.

Figure 3A:
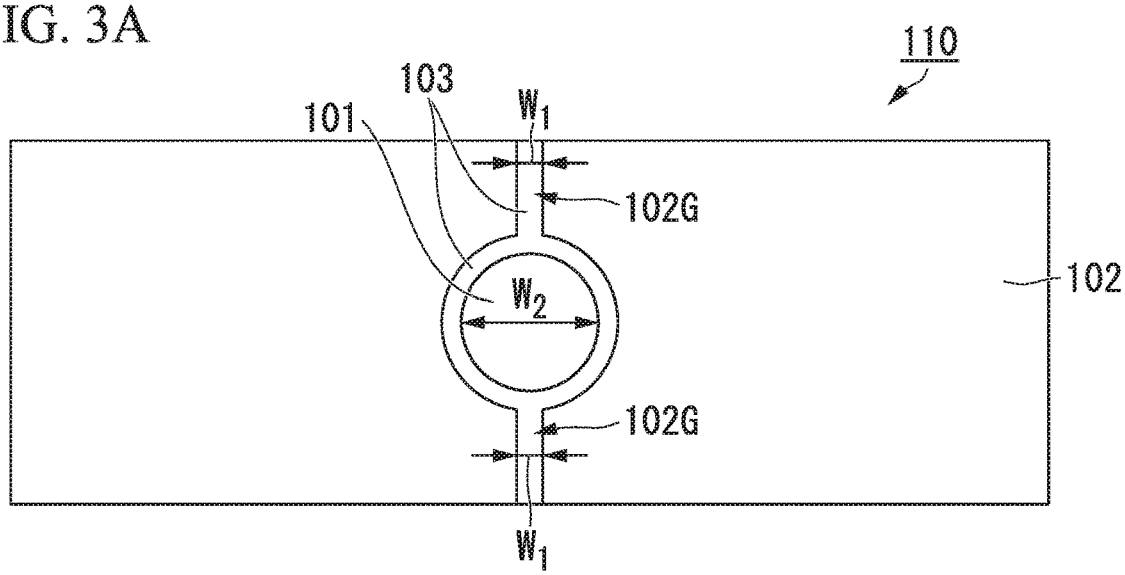
FIGS. 3A to 3C are plan views schematically illustrating configurations of a magnetoresistance effect device according to Modified Example 1 of the first embodiment.
Figure 3B:
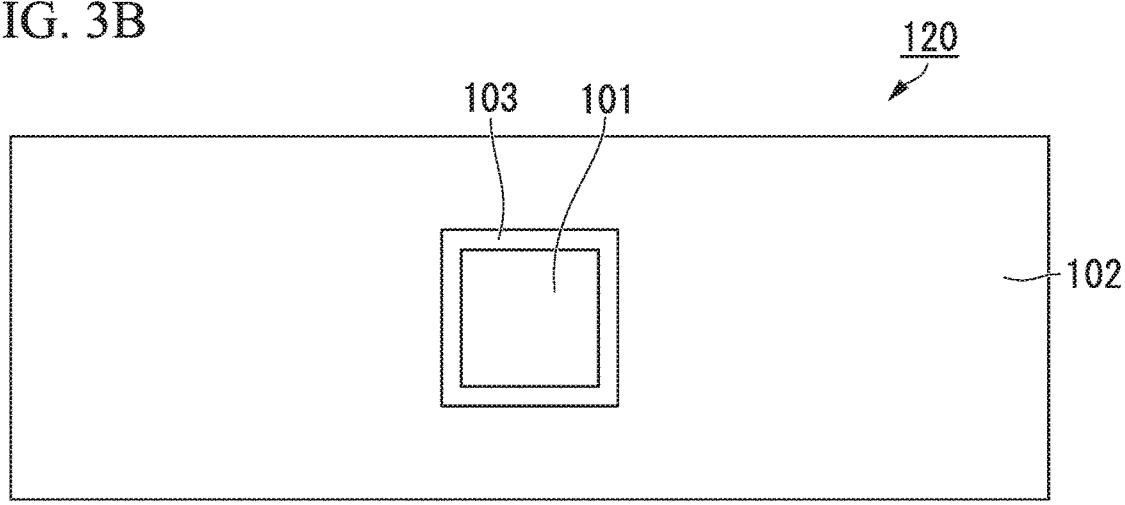
Figure 3C:
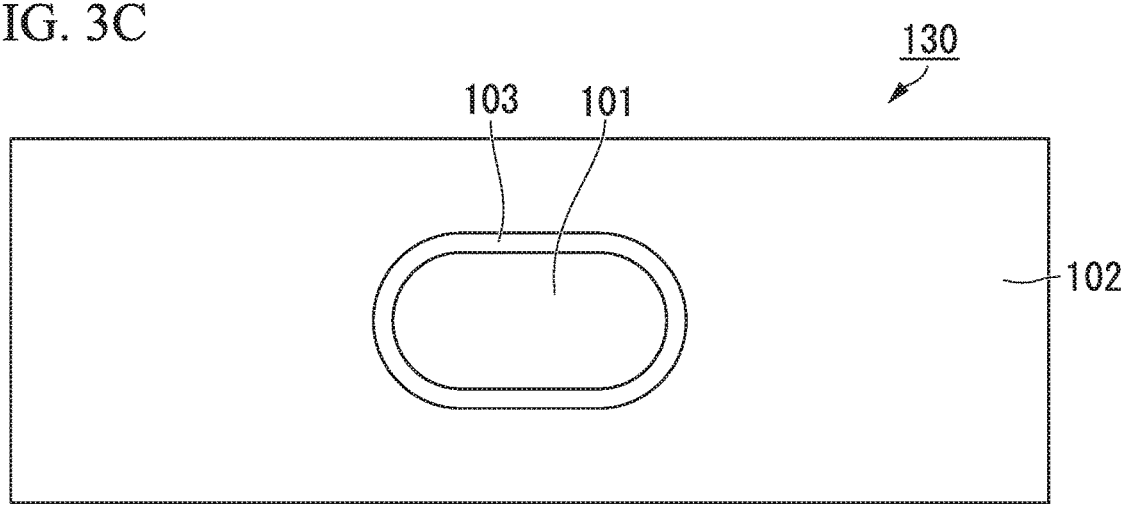

FIGS. 3A to 3C are plan views when magnetoresistance effect devices 110, 120, 130 according to Modified Examples 1 to 3 of this embodiment are seen from the upper electrode 106 side.

Modified Example 1

A part of the outer circumference of the magnetoresistance effect element 101 may not be surrounded by the magnetic material part 102. FIG. 3A illustrates the magnetoresistance effect device 110 in which two parts of the outer circumference of the magnetoresistance effect element 101 are not surrounded by the magnetic material part 102. The same elements as in the first embodiment will be referred to by the same reference signs regardless of a difference in shape. The magnetoresistance effect device 110 includes a gap 102G such that a part of the outer circumference of the magnetoresistance effect element 101 is not surrounded by the magnetic material part 102 in the plan view in the stacking direction L, and the width $W_1$ of the gap 102G in the plan view is smaller than the width $W_2$ of the magnetoresistance effect element 101 in a direction parallel to the direction of the width $W_1$ of the gap 102G. The gap 102G is provided between magnetic material parts 102. In the example illustrated in FIG. 3A, the gap 102G is provided to divide the magnetic material part 102, but the gap 102G may not completely divide the magnetic material part 102 and the magnetic material parts 102 between which the gap 102G is interposed may be partially connected. In the magnetoresistance effect device 110, the isotropy of the magnetic material part collapses in comparison with the case in which the entire circumference of the magnetoresistance effect element is surrounded by the magnetic material part, and thus the distribution of a magnetic field in the magnetoresistance effect element 101 is slightly disturbed, but there is no problem if the part not surrounded by the magnetic material part is sufficiently small. Specifically, it is preferable that the width $W_1$ of the gap 102G be equal to or less than 60% of the width $W_2$ of the magnetoresistance effect element 101. It is preferable that 30% or more of the outer circumference of the magnetoresistance effect element 101 be surrounded by the magnetic material part 102.

Modified Examples 2 and 3

FIGS. 3B and 3C illustrate the magnetoresistance effect devices 120 and 130 as modified examples regarding shapes of the magnetoresistance effect element 101 and the magnetic material part 102 in the plan view in the stacking direction L. The same elements as in the first embodiment will be referred to by the same reference signs regardless of a difference in shape. The shapes of the magnetoresistance effect element and the magnetic material part are not particularly limited and may be rectangular as illustrated in FIG. 3B or may be elliptical as illustrated in FIG. 3C. However, a distance between the outer circumference of the magnetoresistance effect element and the inner circumference of the magnetic material part is preferably substantially constant over the entire circumference.

(Method of Manufacturing Magnetoresistance Effect Device)

The magnetoresistance effect device 100 according to this embodiment can be manufactured, for example, as follows.

First, necessary layer such as a magnetization fixed layer, a spacer layer, and a magnetization free layer are stacked on a base layer or a substrate and unnecessary portions are removed by etching to form a magnetoresistance effect element 101. Stacking of the layers can be performed using a known film forming method such as a sputtering method or a CVD method. Subsequently, an insulating layer with a desired thickness is formed on the entire surface of the resultant, a magnetic layer including a portion which will be the magnetic material part 102 is formed thereon, and unnecessary portions of the insulating layer and the magnetic layer are removed by etching, whereby a magnetoresistance effect device 100 according to this embodiment can be obtained. Forming of the insulating layer and the magnetic layer can be performed using a known film forming method such as a sputtering method or a CVD method.

In the manufacturing method, a magnetoresistance effect device 100 can also be obtained in the same way by forming a magnetoresistance effect element 101, forming a magnetic layer on the entire surface thereof, forming a groove with a predetermined width around the magnetoresistance effect element 101, and filling the groove with an insulating layer.

In the magnetoresistance effect device 100 according to this embodiment, the magnetic material part 102 is arranged to surround the outer circumference of the magnetoresistance effect element 101, and thus isotropy of the magnetic material part 102 with respect to the magnetoresistance effect element 101 is enhanced in comparison with a case in which a magnetoresistance effect element is interposed between magnetic material parts on two sides as in the structure according to the related art. Accordingly, a magnetic field in a lamination plane direction which is applied to the magnetoresistance effect element in the plan view in the stacking direction becomes uniform.

Second Embodiment

Figure 4:
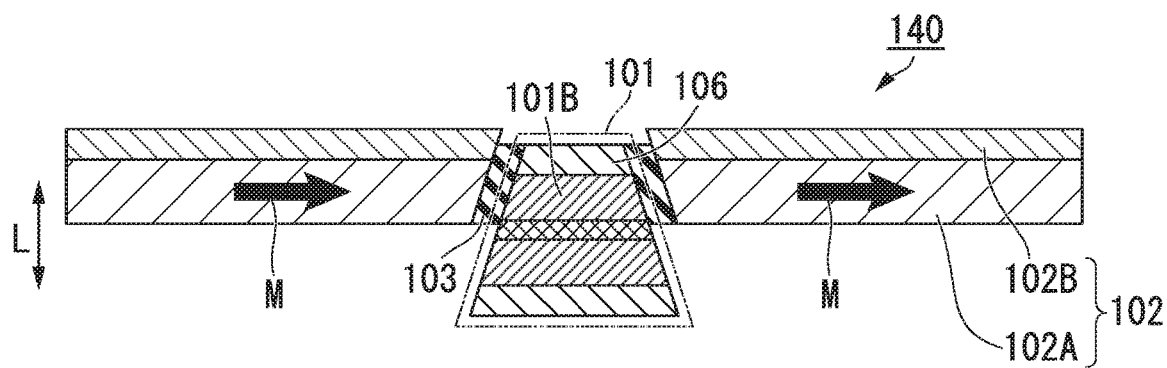
FIG. 4 is a sectional view schematically illustrating a configuration of a magnetoresistance effect device according to a second embodiment of the disclosure.

FIG. 4 is a sectional view schematically illustrating a configuration of a magnetoresistance effect device 140 according to a second embodiment of the disclosure. The same elements as in the first embodiment will be referred to by the same reference signs regardless of a difference in shape. In the magnetoresistance effect device 140, a magnetic material constituting the magnetic material part 102 magnetically couples an antiferromagnetic material 102B to a soft magnetic material 102A to fix magnetization of the soft magnetic material 102A. The antiferromagnetic material 102B may be located on any side of the soft magnetic material 102A in the stacking direction L of the magnetoresistance effect element 101.

As illustrated in FIG. 4, it is preferable that at least a part of the soft magnetic material 102A in the magnetic material part 102 be arranged to surround the outer circumference of the magnetization free layer 101B out of two ferromagnetic layers of the magnetoresistance effect element 101 in the plan view in the stacking direction L.

A soft magnetic material (for example, a NiFe alloy or a CoFe alloy) such as a metal or an alloy thereof including at least one of Fe, Ni, and Co can be used as the material of the soft magnetic material 102A. IrMn or the like can be used as the material of the antiferromagnetic material 102B.

The magnetoresistance effect device 140 according to this embodiment has the same configuration as the magnetoresistance effect device 100 according to the first embodiment except for the magnetic material part 102, and can achieve the same advantages as the magnetoresistance effect device 100 because the magnetic field in the lamination plane direction applied to the magnetization free layer 101B becomes uniform.

Third Embodiment

Figure 5:
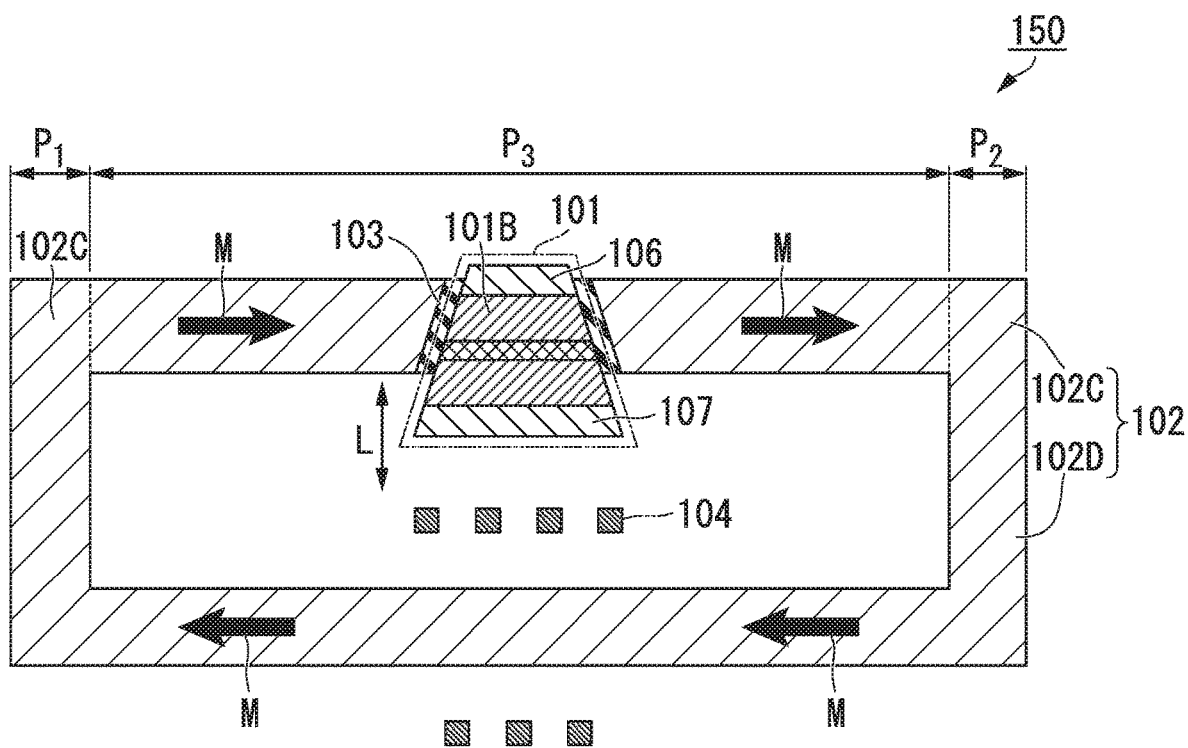
FIG. 5 is a sectional view schematically illustrating a configuration of a magnetoresistance effect device according to a third embodiment of the disclosure.

FIG. 5 is a sectional view schematically illustrating a configuration of magnetoresistance effect device 150 according to a third embodiment of the disclosure. The same elements as in the first embodiment will be referred to by the same reference signs regardless of a difference in shape. The magnetoresistance effect device 150 includes a magnetic material part 102 including a first soft magnetic material 102C and a second soft magnetic material 102D and a coil 104.

Similarly to the magnetic material part 102 in Examples 1 and 2, at least a part of the first soft magnetic material 102C is arranged to surround the outer circumference of the magnetization free layer 101B. The second soft magnetic material 102D is arranged to directly connect one end $P_1$ side of the first soft magnetic material 102C to the other end $P_2$ side without using a central portion $P_3$. The coil 104 is wound around at least a part of the second soft magnetic material 102D. A plurality of second soft magnetic materials 102D around which the coil 104 is wound may be provided.

A soft magnetic material (for example, a NiFe alloy or a CoFe alloy) such as a metal or an alloy thereof including at least one of Fe, Ni, and Co can be used as the material of the first soft magnetic material 102C and the material of the second soft magnetic material 102D. The first soft magnetic material 102C and the second soft magnetic material 102D may be unified or separate from each other.

The magnetoresistance effect device 150 according to this embodiment has the same configuration as the magnetoresistance effect devices 100 and 140 according to Examples 1 and 2 except for the magnetic material part 102, and can achieve the same advantages as the magnetoresistance effect devices 100 and 140 because the magnetic field in the lamination plane direction applied to the magnetization free layer 101B becomes uniform.

Fourth Embodiment

Figure 6:
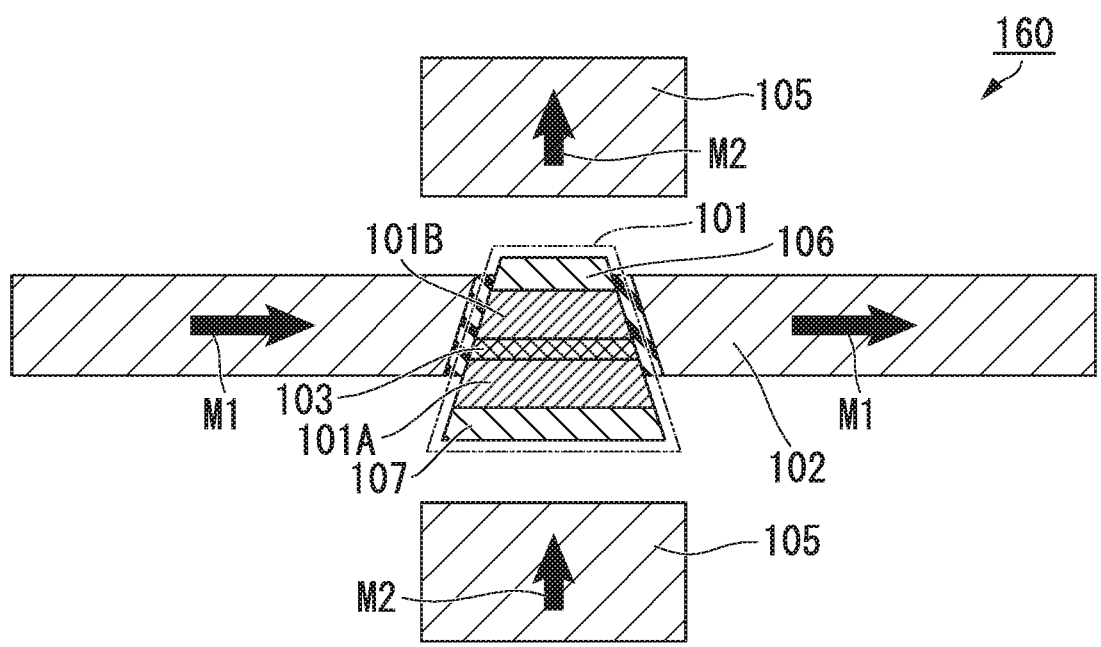
FIG. 6 is a sectional view schematically illustrating a configuration of a magnetoresistance effect device according to a fourth embodiment of the disclosure.

FIG. 6 is a sectional view schematically illustrating a configuration of magnetoresistance effect device 160 according to a fourth embodiment of the disclosure. The same elements as in the first embodiment will be referred to by the same reference signs regardless of a difference in shape. The magnetoresistance effect device 160 includes a magnetic field application mechanism 105 in addition to a magnetic material part 102 which is arranged to surround the outer circumference of the magnetoresistance effect element 101 similarly to the first embodiment. The magnetic field application mechanism 105 is disposed at positions facing ends (an upper electrode 106 and a lower electrode 107 in FIG. 6) in the stacking direction L of the magnetoresistance effect element 101, and can apply a magnetic field having a component in the stacking direction L to the magnetoresistance effect element 101.

The magnetic field application mechanism 105 is formed of a hard magnetic material, and a CoPt alloy, an FePt alloy, a CoCrPt alloy, or the like can be used as the material thereof. The magnetic field application mechanism 105 has magnetization M2 in a direction substantially parallel to the stacking direction L of the magnetoresistance effect element 101. Accordingly, the magnetic field application mechanism 105 applies a magnetic field having a component in the stacking direction L of the magnetoresistance effect element 101 to the magnetoresistance effect element 101. The magnetic field application mechanism 105 applies a magnetic field in a constant direction to the magnetoresistance effect element 101. It is preferable that an axis of easy magnetization of the magnetic field application mechanism 105 have a direction parallel to the stacking direction L of the magnetoresistance effect element 101. In the example illustrated in FIG. 6, the direction of the magnetization M2 of the magnetic field application mechanism 105 is perpendicular to the direction of the magnetization M1 of the magnetic material part 102. In this embodiment, the magnetic field application mechanism 105 may be configured by magnetically coupling a soft magnetic material and an antiferromagnetic material to each other and fixing magnetization of the soft magnetic material.

The magnetoresistance effect device 160 according to this embodiment has the same configuration as the magnetoresistance effect devices 100, 140, and 150 according to the first to third embodiments except for the magnetic field application mechanism 105. Since the magnetoresistance effect device 160 includes the magnetic material part 102 and the magnetic field application mechanism 105 of which the magnetization directions are perpendicular to each other, a magnetic field can be applied in a direction oblique with respect to the lamination plane direction and the stacking direction L of the magnetoresistance effect element 101 depending on usage thereof.

Fifth Embodiment

Figure 7:
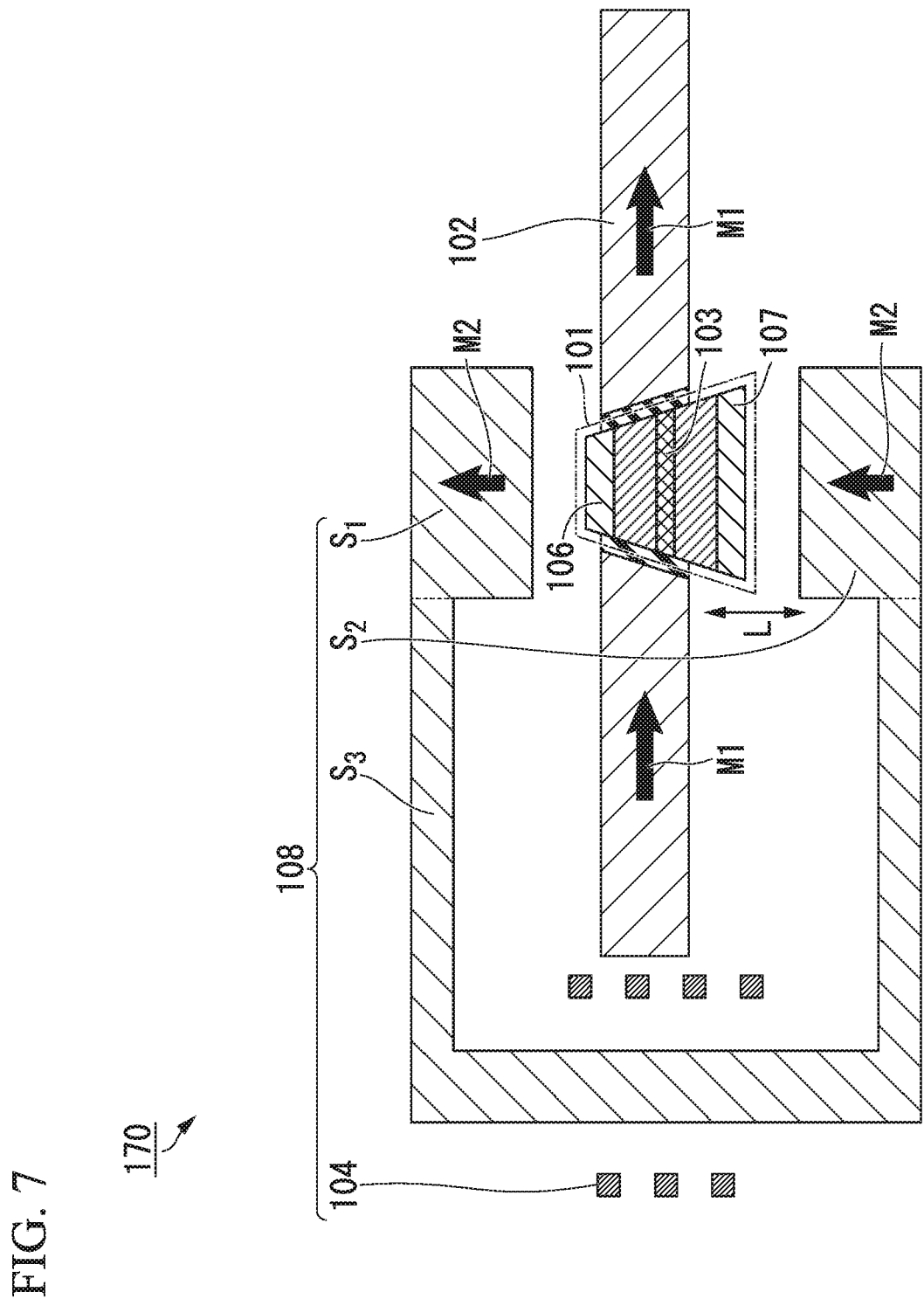
FIG. 7 is a sectional view schematically illustrating a configuration of a magnetoresistance effect device according to a fifth embodiment of the disclosure.

FIG. 7 is a sectional view schematically illustrating a configuration of magnetoresistance effect device 170 according to a fifth embodiment of the disclosure. The same elements as in the first embodiment will be referred to by the same reference signs regardless of a difference in shape. The magnetoresistance effect device 170 includes a magnetic material part 102 which is arranged in the same way as in the first embodiment and a magnetic field application mechanism 108. A magnetic material constituting the magnetic material part 102 is a hard magnetic material, and a magnetic material constituting a part (portions $S_1$ to $S_3$ which will be described later) of the magnetic field application mechanism 108 is a soft magnetic material.

The magnetic field application mechanism 105 according to the fourth embodiment is separately disposed on the sides facing the ends of the magnetoresistance effect element 101, but the magnetic field application mechanism 108 according to this embodiment is unified as one body. Specifically, the magnetic field application mechanism 108 includes a portion $S_1$ disposed on a side facing one end (an upper electrode 106 in FIG. 7) of the magnetoresistance effect element 101 in the stacking direction L, a portion $S_2$ which is disposed on a side facing the other end (a lower electrode 107 in FIG. 7), a portion $S_3$ which connects the portion $S_1$ to the portion $S_2$, and a coil 104. The coil 104 is wound around at least a part of the portion $S_3$. Magnetic flux generated from the coil 104 is transmitted to the portion $S_3$; the portion $S_1$ and the portion $S_2$; and then the portion $S_3$, and the magnetic field application mechanism applies a magnetic field having a component in the stacking direction L of the magnetoresistance effect element 101 to the magnetoresistance effect element 101.

The magnetoresistance effect device 170 according to this embodiment has the same configuration as the magnetoresistance effect device 160 according to the fourth embodiment except for the magnetic field application mechanism 108, and can achieve the same advantages as the magnetoresistance effect device 160.

Sixth Embodiment

Figure 8:
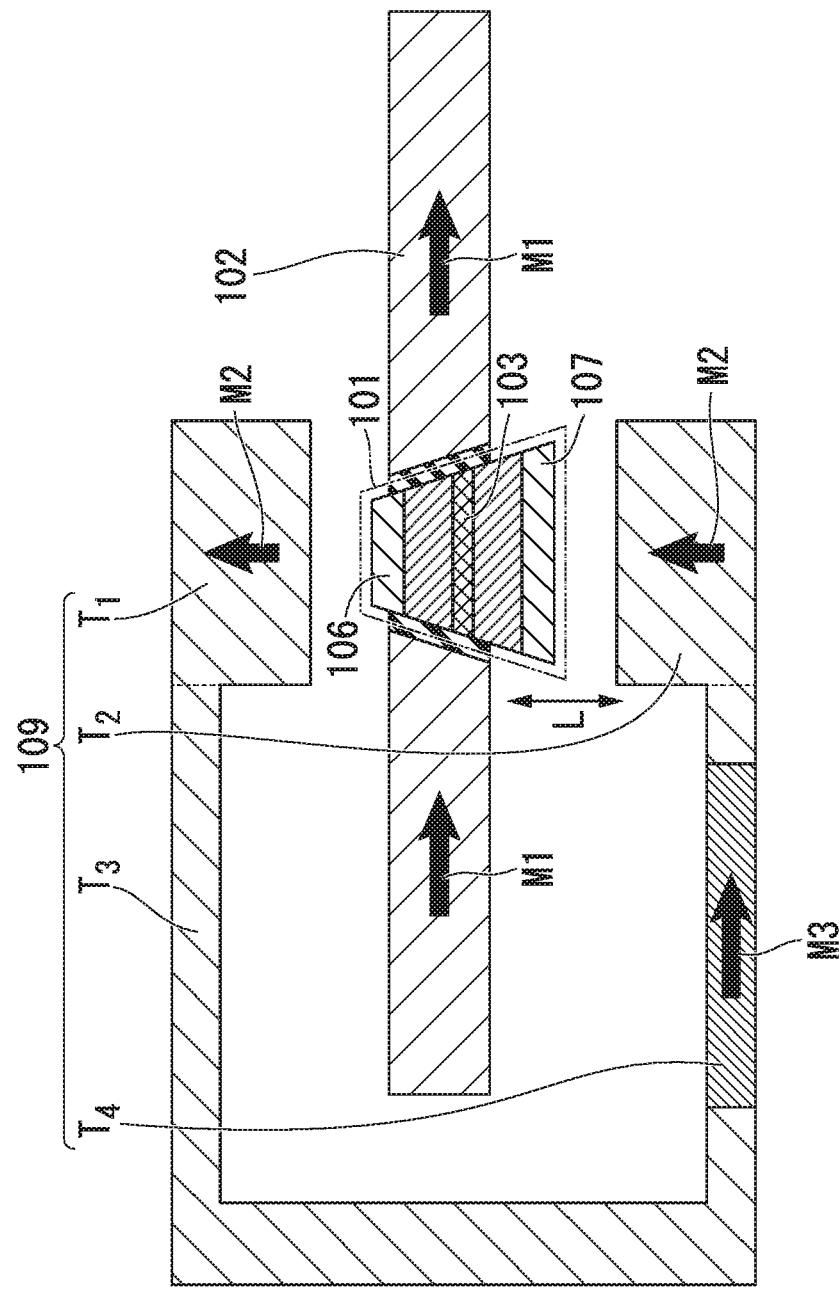
FIG. 8 is a sectional view schematically illustrating a configuration of a magnetoresistance effect device according to a sixth embodiment of the disclosure.

FIG. 8 is a sectional view schematically illustrating a configuration of magnetoresistance effect device 180 according to a sixth embodiment of the disclosure. The same elements as in the first embodiment will be referred to by the same reference signs regardless of a difference in shape. The magnetoresistance effect device 180 includes a magnetic material part 102 which is arranged in the same way as in the first embodiment and a magnetic field application mechanism 109.

The magnetic field application mechanism 109 includes a portion $T_1$ which is disposed on a side facing one end (an upper electrode 106 in FIG. 8) of the magnetoresistance effect element 101 in the stacking direction L, a portion $T_2$ which is disposed on a side facing the other end (a lower electrode 107 in FIG. 8), a portion $T_3$ which connects the portion $T_1$ and the portion $T_2$, and a hard magnetic material $T_4$ which is included in at least part of the portion $T_3$. Portions other than the portion $T_4$ of the magnetic field application mechanism 109 are formed of a soft magnetic material. The hard magnetic material $T_4$ has a magnetization M3 in substantially one direction and thus the portion $T_1$ and the portion $T_2$ are magnetized to have the magnetization M2 in the direction which is substantially parallel to the stacking direction L of the magnetoresistance effect element 101. Accordingly, the magnetic field application mechanism 109 applies a magnetic field having a component in the stacking direction L of the magnetoresistance effect element 101 to the magnetoresistance effect element 101. In this embodiment, the portion of the hard magnetic material $T_4$ may be replaced with a portion in which a soft magnetic material and an antiferromagnetic material are magnetically coupled and magnetization of the soft magnetic material is fixed.

The magnetoresistance effect device 180 according to this embodiment has the same configuration as the magnetoresistance effect device 170 according to the fifth embodiment except for the magnetic field application mechanism 109, and can achieve the same advantages as the magnetoresistance effect device 170.

Seventh Embodiment

Figure 9:
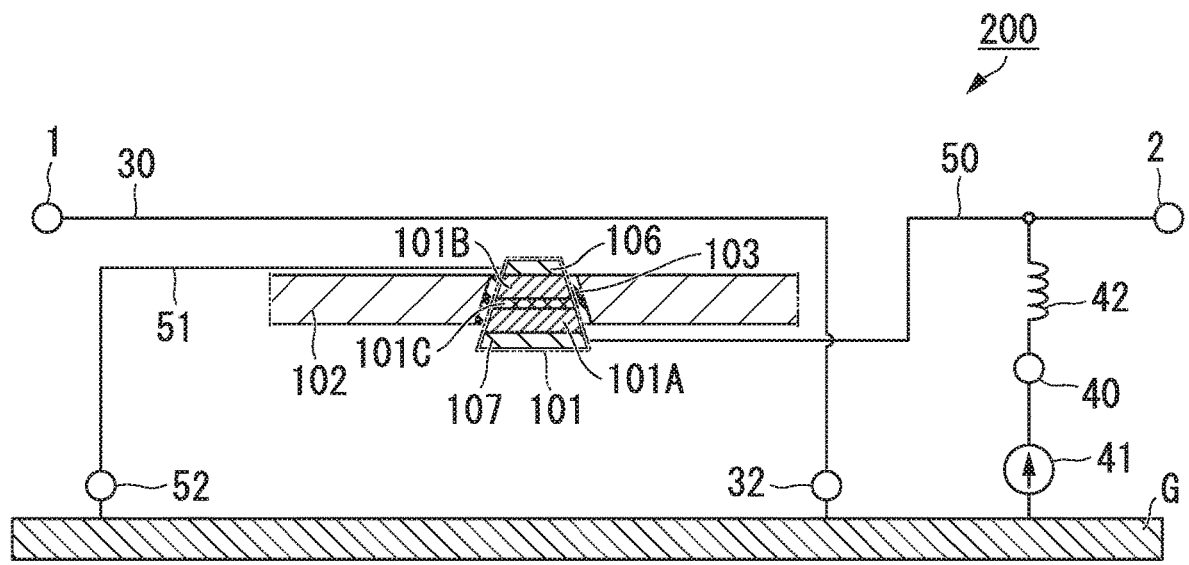
FIG. 9 is a diagram schematically illustrating a circuit configuration of a high-frequency device using the magnetoresistance effect device according to the first embodiment.

FIG. 9 is a diagram schematically illustrating a circuit configuration of a high-frequency device 200 according to a seventh embodiment using the magnetoresistance effect device according to the first embodiment. The high-frequency device 200 illustrated in FIG. 9 includes a magnetoresistance effect element 101, a magnetic material part 102, a first signal line 30, and a direct current application terminal 40. In the high-frequency device 200, a signal is input from a first port 1 and a signal is output from a second port 2.

<Magnetoresistance Effect Element and Magnetic Field Application Mechanism>

As the magnetoresistance effect element 101 and the magnetic material part 102, the elements of the magnetoresistance effect device according to the first embodiment are used. Only principal portions of the magnetic material part 102 are illustrated in FIG. 9.

<First Port and Second Port>

The first port 1 is an input terminal of the high-frequency device 200. The first port 1 corresponds to one end of the first signal line 30. By connecting an AC signal source (not illustrated) to the first port 1, an AC signal (a high-frequency signal) can be applied to the high-frequency device 200. The high-frequency signal applied to the high-frequency device 200 is, for example, a signal with a frequency of 100 MHz or higher.

The second port 2 is an output terminal of the high-frequency device 200. The second port 2 corresponds to one end of an output signal line (a second signal line) 50 that transmits a signal which is output from the magnetoresistance effect element 101.

<First Signal Line>

One end of the first signal line 30 in FIG. 9 is connected to the first port 1. The high-frequency device 200 is used in a state in which the other end of the first signal line 30 is connected to a reference potential via a reference potential terminal 32. In FIG. 9, the other end of the first signal line 30 is connected to the ground G as the reference potential. The ground G may be one outside the high-frequency device 200. A high-frequency current flows in the first signal line 30 based on a potential difference between a high-frequency signal input to the first port 1 and the ground G. When a high-frequency current flows in the first signal line 30, a high-frequency magnetic field is generated from the first signal line 30. This high-frequency magnetic field is applied to the magnetization free layer 101B of the magnetoresistance effect element 101.

The first signal line 30 is not limited to a single signal line, and may include a plurality of signal lines. In this case, it is preferable that the plurality of signal lines be arranged such that high-frequency magnetic fields generated from the signal lines are reinforced at a position of the magnetoresistance effect element 101.

<Output Signal Line and Line>

The output signal line 50 transmits a signal output from the magnetoresistance effect element 101. The signal output from the magnetoresistance effect element 101 is a signal with a frequency which is selected using ferromagnetic resonance of the magnetization free layer 101B. One end of the output signal line 50 in FIG. 9 is connected to the magnetoresistance effect element 101 and the other end is connected to the second port 2. That is, the output signal line 50 in FIG. 9 connects the magnetoresistance effect element 101 to the second port 2.

A capacitor may be provided in the output signal line 50 (for example, the output signal line 50 between a position at which an inductor 42 is connected to the output signal line 50 and the second port 2) between a part constituting a closed circuit using a power source 41, the output signal line 50, the magnetoresistance effect element 101, a signal line 51, and the ground G and the second port 2. By providing a capacitor in the part, it is possible to prevent an invariant component of a current from being added to an output signal output from the second port 2.

One end of the signal line 51 is connected to the magnetoresistance effect element 101. The high-frequency device 200 is used in a state in which the other end of the signal line 51 is connected to a reference potential via a reference potential terminal 52. In FIG. 9, the signal line 51 is connected to the ground G which is common to the reference potential of the first signal line 30, but it may be connected to other reference potential. For the purpose of simplification of a circuit configuration, it is preferable that the reference potential of the first signal line 30 and the reference potential of the signal line 51 be common.

The shapes of the signal lines and the ground G are preferably defined as a microstrip line (MSL) type or a coplanar waveguide (CPW) type. When the shapes are designed as a microstrip line (MSL) type or a coplanar waveguide (CPW) type, it is preferable that signal line widths or distances to the ground be designed such that characteristic impedances of the signal lines are equal to impedance of the circuit system. By employing this design, it is possible to curb transmission loss of the signal lines.

<Direct Current Application Terminal>

The direct current application terminal 40 is connected to the power source 41 and applies a direct current or a direct-current voltage in the stacking direction of the magnetoresistance effect element 101. A direct current in this specification is a current of which the direction does not change over time and includes a current of which the magnitude varies over time. The direct-current voltage is a voltage of which the polarity does not change over time and includes a voltage of which the magnitude varies over time. The power source 41 may be a direct current source or a DC voltage source.

The power source 41 may be a direct current source that can generate a constant direct current or may be a direct-current voltage source that can generate a constant direct-current voltage. The power source 41 may be a direct current source in which the magnitude of the direct current generated therefrom can vary or may be a direct-current voltage source in which the magnitude of a DC voltage generated therefrom can vary.

It is preferable that a current density of a current applied to the magnetoresistance effect element 101 be less than an oscillation threshold current density of the magnetoresistance effect element 101. The oscillation threshold current density of the magnetoresistance effect element 101 is a current density with a threshold value with which the magnetization of the magnetization free layer 101B of the magnetoresistance effect element 101 starts precession at a constant frequency and with a constant amplitude and the magnetoresistance effect element 101 oscillates (the output (resistance value) of the magnetoresistance effect element 101 varies at a constant frequency and with a constant amplitude) with application of a current with a current density equal to or greater than the threshold value.

An inductor 42 is disposed between the direct current application terminal 40 and the output signal line 50. The inductor 42 cuts off a high-frequency component of a current and transmits an invariant component of the current. The output signal (a high-frequency signal) output from the magnetoresistance effect element 101 flows efficiently to the second port 2 by the inductor 42. By the inductor 42, the invariant component of the current flows in a closed circuit which is constituted by the power source 41, the output signal line 50, the magnetoresistance effect element 101, the signal line 51, and the ground G.

A chip inductor, an inductor based on a pattern line, a resistance element including an inductance component, or the like can be used as the inductor 42. The inductance of the inductor 42 is preferably equal to or greater than 10 nH.

<Function of High-Frequency Device>

When a high-frequency signal is input from the first port 1 to the high-frequency device 200, a high-frequency current corresponding to the high-frequency signal flows in the first signal line 30. A high-frequency magnetic field which his generated by the high-frequency current flowing in the first signal line 30 is applied to the magnetization free layer 101B of the magnetoresistance effect element 101.

The magnetization of the magnetization free layer 101B fluctuates greatly when the frequency of the high-frequency magnetic field applied to the magnetization free layer 101B via the first signal line 30 is close to the ferromagnetic resonance frequency of the magnetization free layer 101B. This phenomenon is a ferromagnetic resonance phenomenon.

When fluctuation of the magnetization of the magnetization free layer 101B increases, change in resistance value of the magnetoresistance effect element 101 increases. For example, when a constant direct current is applied from the direct current application terminal 40 to the magnetoresistance effect element 101, the change in resistance value of the magnetoresistance effect element 101 is output as a potential difference between the lower electrode 107 and the upper electrode 106 from the second port 2. For example, when a constant DC voltage is applied from the direct current application terminal 40 to the magnetoresistance effect element 101, the change in resistance value of the magnetoresistance effect element 101 is output as change in current value flowing between the lower electrode 107 and the upper electrode 106 from the second port 2.

That is, when the frequency of a high-frequency signal input from the first port 1 is close to the ferromagnetic resonance frequency of the magnetization free layer 101B, the change in resistance value of the magnetoresistance effect element 101 is large and a high-level signal is output from the second port 2. On the other hand, when the frequency of the high-frequency signal is distant from the ferromagnetic resonance frequency of the magnetization free layer 101B, the change in resistance value of the magnetoresistance effect element 101 is small and a signal is not output well from the second port 2. That is, the high-frequency device 200 serves as a high-frequency filter that can selectively pass only a high-frequency signal with a specific frequency.

<Other Usage>

An example in which the high-frequency device is used as a high-frequency filter has been described above, but the magnetoresistance effect device can also be used as a high-frequency device such as an isolator, a phase shifter, or an amplifier.

When the high-frequency device is used as an isolator, a signal is input from the second port 2. Even when a signal is input from the second port 2, a signal is not output from the first port 1 and thus the high-frequency device serves as an isolator.

When the high-frequency device is used as a phase shifter, attention is paid to an arbitrary frequency point in a frequency band which is output when the output frequency band varies. When the output frequency band varies, the phase at a specific frequency also varies and thus the high-frequency device serves as a phase shifter.

When the high-frequency device is used as an amplifier, the direct current or the direct-current voltage applied from the power source 41 is set to have a predetermined magnitude or greater. By employing this configuration, a signal output from the second port becomes higher than the signal input from the first port 1 and thus the high-frequency device serves as an amplifier.

As described above, the high-frequency device 200 according to the seventh embodiment can serve as a high-frequency device such as a high-frequency filter, an isolator, a phase shifter, or an amplifier.

FIG. 9 illustrates an example in which the number of magnetoresistance effect elements 101 is one, but the number of magnetoresistance effect elements 101 may be two or more. In this case, a plurality of magnetoresistance effect elements 101 may be connected in parallel or may be connected in series. For example, by using a plurality of magnetoresistance effect elements 101 having different ferromagnetic resonance frequencies, a selectable frequency band (a passing frequency band) can be widened. A configuration in which a high-frequency magnetic field generated from the output signal line 50 that outputs an output signal output from one magnetoresistance effect element is applied to other magnetoresistance effect element may be employed. By employing this configuration, a signal to be output is filtered a plurality of times. Accordingly, it is possible to enhance filtering accuracy of a high-frequency signal.

Figure 10:
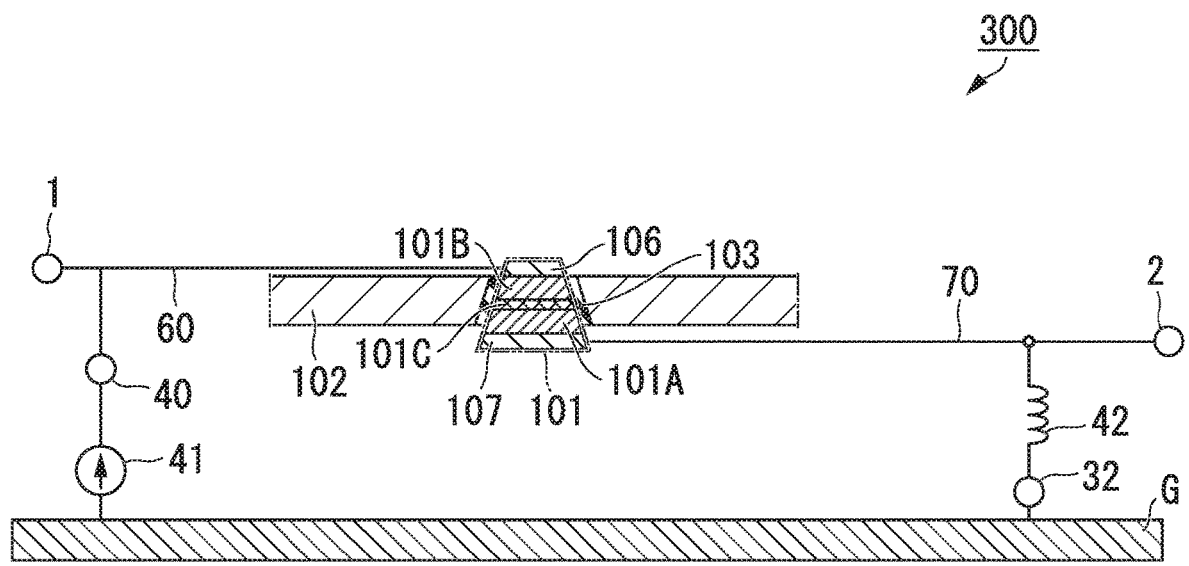
FIG. 10 is a diagram schematically illustrating another circuit configuration of the high-frequency device using the magnetoresistance effect device according to the first embodiment.

The high-frequency device 200 illustrated in FIG. 9 is a high-frequency device of a magnetic field driven type that is driven by applying a high-frequency magnetic field from the first signal line 30 to the magnetization free layer 101B. The high-frequency device is not limited to the magnetic field driven type, but may be a current driven type. FIG. 10 is a diagram schematically illustrating a circuit configuration of a current driven type high-frequency device using the magnetoresistance effect device according to the first embodiment.

A high-frequency device 300 illustrated in FIG. 10 includes a magnetoresistance effect element 101, a magnetic material part 102, a direct current application terminal 40, an input signal line 60, and an output signal line 70. In FIG. 10, only principal ports of the magnetic material part 102 are illustrated. The same elements as in the high-frequency device 200 illustrated in FIG. 9 will be referred to by the same reference signs. The input signal line 60 is a line between the first port 1 and the upper electrode 106 and the output signal line 70 is a line between the second port 2 and the lower electrode 107.

In the high-frequency device 300, a signal is input from the first port 1 and a signal is output from the second port 2. In the high-frequency device 300 illustrated in FIG. 10, magnetization of the magnetization free layer 101B fluctuates by a spring transfer torque which is generated by allowing a current to flow in the stacking direction of the magnetoresistance effect element 101. When the frequency of an input high-frequency signal is close to the ferromagnetic resonance frequency of the magnetization free layer 101B (in this case, also referred to as a spring torque resonance frequency of the magnetoresistance effect element 101), the magnetization of the magnetization free layer 101B fluctuates greatly. When the magnetization of the magnetization free layer 101B fluctuates periodically, the resistance value of the magnetoresistance effect element 101 changes periodically.

That is, when the frequency of a high-frequency signal input from the first port 1 is close to the ferromagnetic resonance frequency of the magnetization free layer 101B, the change in resistance value of the magnetoresistance effect element 101 is large and a high-level signal is output from the second port 2. On the other hand, when the frequency of the high-frequency signal is distant from the ferromagnetic resonance frequency of the magnetization free layer 101B, the change in resistance value of the magnetoresistance effect element 101 is small and a signal is not output well from the second port 2. That is, the high-frequency device 300 can also serve as a high-frequency filter that can selectively pass only a high-frequency signal with a specific frequency.

While embodiments of the disclosure have been described above in detail with reference to the drawings, the elements in the embodiments and combinations thereof are only examples and addition, omission, and replacement of elements and other modifications can be made without departing from the scope of the disclosure.

Figure 11:
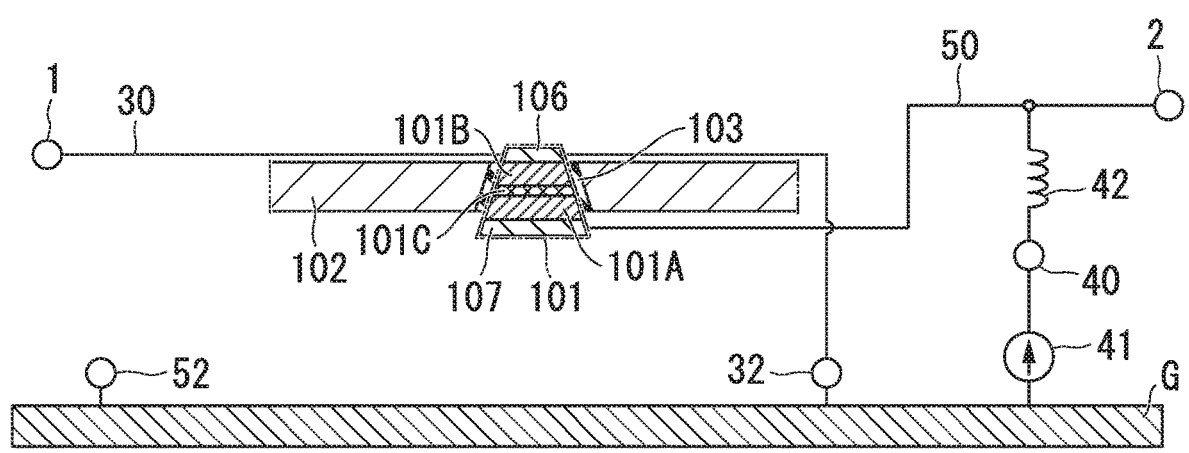
FIG. 11 is a diagram schematically illustrating another circuit configuration of the high-frequency device using the magnetoresistance effect device according to the first embodiment.

For example, the first signal line 30 may also serve as the lower electrode 107 or the upper electrode 106 which is connected to the magnetoresistance effect element 101. FIG. 11 is a diagram schematically illustrating a high-frequency device in which the first signal line 30 also serves as the upper electrode 106 connected to the magnetoresistance effect element 101. In the high-frequency device illustrated in FIG. 11, the first signal line 30 is connected to the magnetization free layer 101B of the magnetoresistance effect element 101. In this case, magnetization of the magnetization free layer 101B can be made to fluctuate using a high-frequency magnetic field which is generated by a high-frequency current flowing in the first signal line 30 and applied to the magnetization free layer 101B. The magnetization of the magnetization free layer 101B may be made to fluctuate using a spin transfer torque which is generated by a high-frequency current flowing in the stacking direction of the magnetoresistance effect element 101 from the first signal line 30. A spin current is generated in a direction perpendicular to the direction of the high-frequency current flowing in a part of the first signal line 30 corresponding to the upper electrode 106. The magnetization of the magnetization free layer 101B may be made to fluctuate using a spin-orbit torque based on the spin current. That is, the magnetization of the magnetization free layer 101B can be made to fluctuate using at least one of the high-frequency magnetic field, the spring transfer torque, and the spin-orbit torque.

In the high-frequency devices 200 and 300, the direct current application terminal 40 may be connected between the inductor 42 and the ground G or may be connected between the upper electrode 106 and the ground G.

A resistive element may be used instead of the inductor 42 in the above-mentioned embodiments. The resistive element has a function of cutting off a high-frequency component of a current using a resistance component. The resistive element may be one of a chip resistor and a resistor based on a pattern line. It is preferable that the resistance value of the resistive element be equal to or greater than characteristic impedance of the output signal line 50. For example, when the characteristic impedance of the output signal line 50 is 50Ω and the resistance value of the resistive element is 50Ω, high-frequency power of 45% can be cut off by the resistive element. When the characteristic impedance of the output signal line 50 is 50Ω and the resistance value of the resistive element is 500Ω, high-frequency power of 90% can be cut off by the resistive element. In this case, an output signal output from the magnetoresistance effect element 101 can be made to efficiently flow to the second port 2.

In the above-mentioned embodiments, when the power source 41 connected to the direct current application terminal 40 has a function of cutting off a high-frequency component of a current and transmitting an invariant component of the current, the inductor 42 is not necessary. In this case, an output signal output from the magnetoresistance effect element 101 can be made to efficiently flow to the second port 2.

The magnetoresistance effect devices according to the embodiments can be applied to an oscillator using a spin torque oscillation effect in which magnetization of a magnetization free layer fluctuates by applying a direct current to a magnetoresistance effect element. The magnetoresistance effect devices according to the embodiments can also be applied to a rectifier or a wave detector using a spin-torque diode effect in which a DC voltage is generated due to fluctuation of the magnetization of the magnetization free lay when a high-frequency current (an alternating current) is applied to the magnetoresistance effect element.

In the seventh embodiment, the magnetoresistance effect device according to the first embodiment is applied as a high-frequency device, but the magnetoresistance effect devices according to other embodiments can also be applied in this way. When a magnetoresistance effect device including a coil is applied as in the third and fifth embodiments, the intensity of a static magnetic field applied to the magnetoresistance effect element can be changed and thus it is possible to control the ferromagnetic resonance frequency of the magnetization free layer of the magnetoresistance effect element.

An example in which a magnetoresistance effect device is used as a high-frequency device has been described above, but the magnetoresistance effect device can also be applied as other devices such as a magnetic sensor.

EXAMPLES

The advantages of the disclosure will become more apparent from the following examples. The invention is not limited to the following examples and can be appropriately modified without departing from the gist thereof.

A distribution of a magnetic field which is formed in a magnetoresistance effect element (a magnetization free layer) was simulated depending on the configuration of the magnetic material part. Here, two directions perpendicular to each other in a lamination plane of the magnetoresistance effect element are defined as an X direction and a Y direction.

Example 1

Figure 12A:
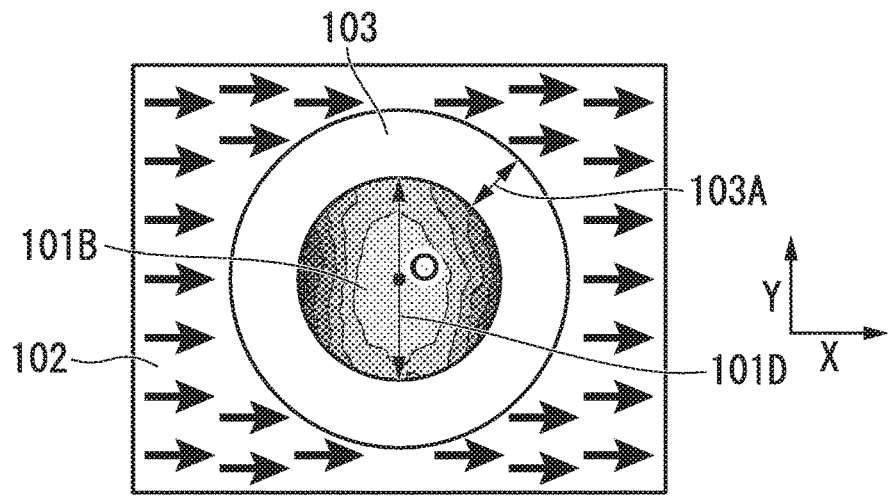
FIGS. 12A to 12C are sectional views schematically illustrating configurations of the magnetoresistance effect devices according to Examples 1 and 2 of the disclosure and Comparative Example 1.

FIG. 12A is a sectional view of the magnetoresistance effect device 100 according to the first embodiment (FIG.

1B) which is taken along a plane passing through the magnetization free layer 101B, and illustrates a magnetic field distribution in a state in which a magnetic field is applied to the magnetization free layer 101B using the magnetic material part 102. The magnetic material part 102 is magnetized in the X direction (in a rightward direction) in all parts thereof (which is indicated by arrows). In simulation setting conditions, a diameter 101D of the magnetoresistance effect element 101 is set to 120 nm, a width 103A of the insulation part 103 is set to 40 nm, and the magnitude of the magnetization of the magnetic material part 102 is set to 1.5 kG.

Example 2

Figure 12B:
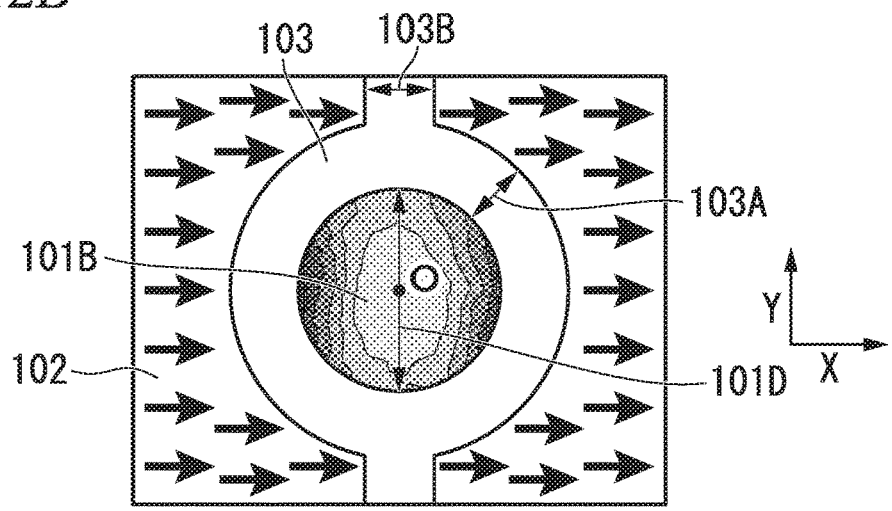

FIG. 12B is a sectional view of the magnetoresistance effect device 110 according to Modified Example 1 (FIG. 3A) of the first embodiment which is taken along a plane passing through the magnetization free layer 101B, and illustrates a state in which a magnetic field is applied to the magnetization free layer 101B using the magnetic material part 102 in the same way as in Example 1. The magnetic material part 102 is magnetized in the X direction (in a rightward direction) in all parts thereof (which is indicated by arrows). In simulation setting conditions, the diameter 101D of the magnetoresistance effect element 101 is set to 120 nm, the width 103A and 103B of the insulation part 103 between the magnetization free layer 101B and the magnetic material part 102 and between the magnetic material parts 102 is set to 40 nm, and the magnitude of the magnetization of the magnetic material part 102 is set to 1.5 kG.

Comparative Example 1

Figure 12C:
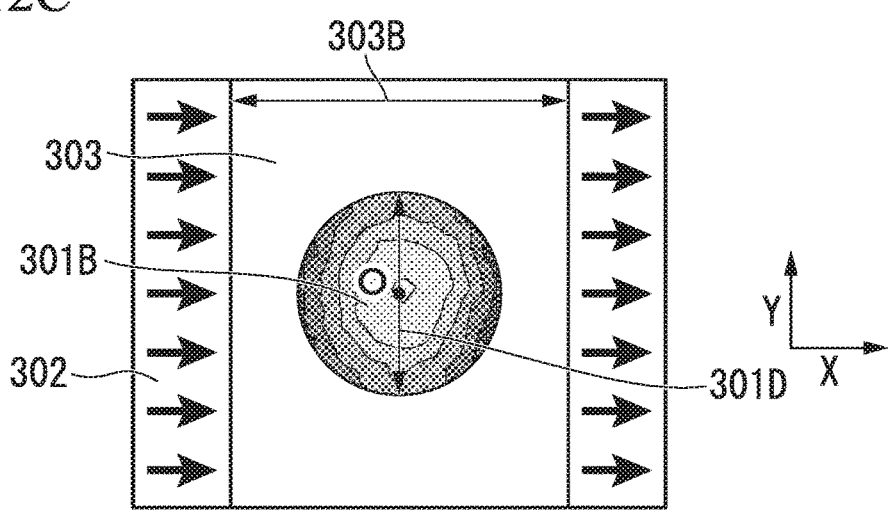

FIG. 12C is a sectional view of a magnetoresistance effect device according to Comparative Example 1, and illustrates a state in which a magnetic field is applied to a magnetization free layer 301B using a magnetic material part 302 in the same way as in Examples 1 and 2. The magnetoresistance effect device according to Comparative Example 1 is configured such that two magnetic material parts 302 face each other with a magnetoresistance effect element (a magnetization free layer 301B) interposed therebetween. The magnetic material parts 302 are magnetized in the X direction (in a rightward direction) in all parts thereof (which is indicated by arrows). In simulation setting conditions, a diameter 301D of the magnetization free layer is set to 120 nm, a width 303B of an insulation part 303 between the magnetic material parts 302 is set to 200 nm, and the magnitude of the magnetization of the magnetic material parts 302 is set to 1.5 kG.

Figure 13A:
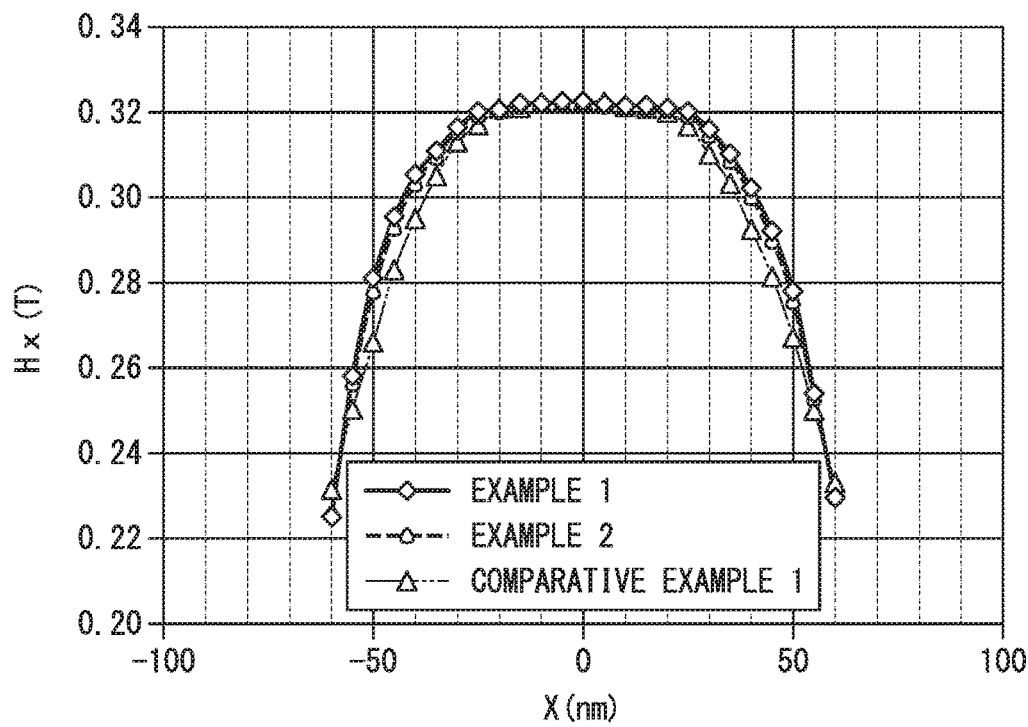
FIGS. 13A and 13B are graphs illustrating distributions of a magnetic field in an X direction and a Y direction of the magnetoresistance effect devices according to Examples 1 and 2 of the disclosure and Comparative Example 1.
Figure 13B:
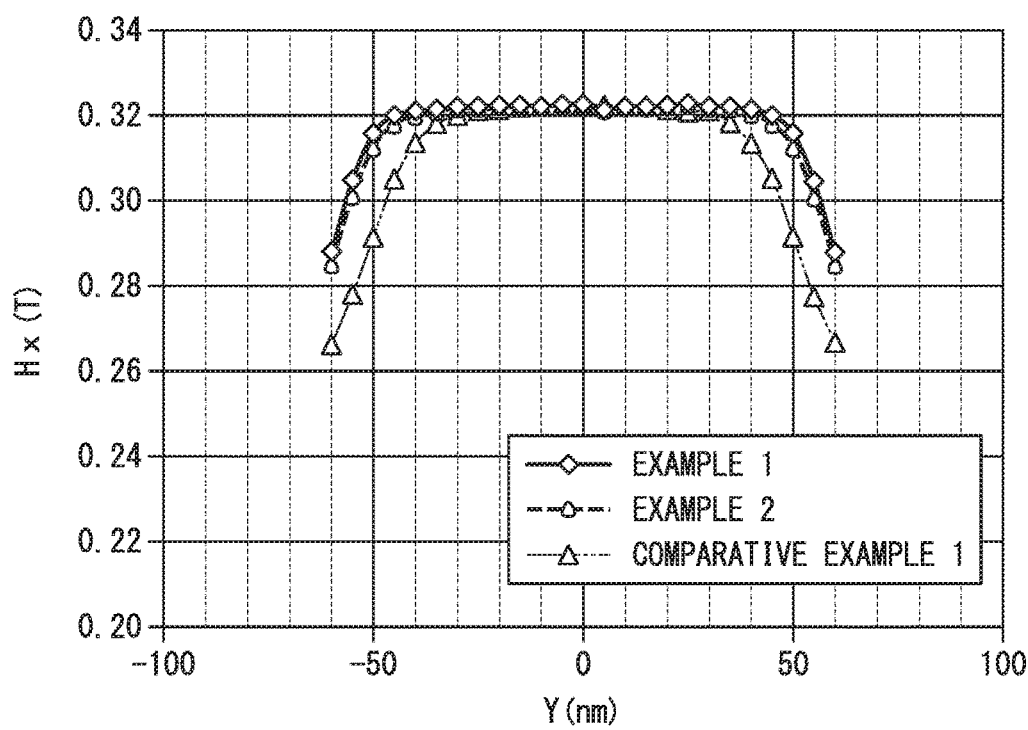

FIGS. 13A and 13B are graphs illustrating results of simulation which was performed on a distribution of a magnetic field applied to the magnetization free layer in Examples 1 and 2 and Comparative Example 1. In the graph illustrated in FIG. 13A, the horizontal axis represents a distance from the center O of the magnetization free layer in the X direction and the vertical axis represents an X component Hx of a magnetic field applied to the magnetization free layer in a plane including the center O. In the graph illustrated in FIG. 13B, the horizontal axis represents a distance from the center O of the magnetization free layer in the Y direction and the vertical axis represents an X component Hx of a magnetic field applied to the magnetization free layer in a plane including the center O.

In FIG. 13A, the X component Hx of the magnetic field in Examples 1 and 2 in the X direction is uniformly distributed in a wider range in comparison with the X component Hx in Comparative Example 1. In FIG. 13B, the X component Hx of the magnetic field in Examples 1 and 2 in the Y direction is uniformly distributed in a wider range in comparison with the X component Hx of the magnetic field in Comparative Example 1. From these results, it can be seen that uniformity of the magnetic field in the X direction and the Y direction in Examples 1 and 2 is improved as compared with that in Comparative Example 1 and domains are not likely to be formed in the magnetization free layer.

The magnetic field applied to the magnetization free layer in Example 2 exhibits the same distribution as in Example 1 in both the X direction and the Y direction. From these results, it can be seen that the same magnetic field distribution as in Example 1 can be obtained when the magnetic material part is not formed over the entire circumference of the magnetoresistance effect element but a range in which the magnetic material part is not formed is sufficiently small.

What is claimed is:

1. A magnetoresistance effect device comprising:
    a magnetoresistance effect element that includes:
        a first magnetization free layer,
        a magnetization fixed layer or a second magnetization free layer, and
        a spacer layer interposed between the first magnetization free layer and the magnetization fixed layer or the second magnetization free layer; and
    a magnetic material part configured to apply a magnetic field to the magnetoresistance effect element,
    wherein:
        the magnetic material part is arranged to surround an outer circumference of the magnetoresistance effect element in a plan view in a stacking direction of the magnetoresistance effect element, and
        the magnetic material part contains a hard magnetic material.

2. The magnetoresistance effect device according to claim 1, wherein the magnetic material part is arranged to surround an entire outer circumference of the magnetoresistance effect element in the plan view in the stacking direction.

3. The magnetoresistance effect device according to claim 2, wherein the magnetic material part is arranged to surround at least an outer circumference of the first magnetization free layer.

4. The magnetoresistance effect device according to claim 1, wherein a gap is formed in the magnetic material part in such a way that a part of the outer circumference of the magnetoresistance effect element is free of the magnetic material part surrounding the magnetoresistance effect element in the plan view in the stacking direction,
    wherein a width of the gap in the plan view is smaller than a width of the magnetoresistance effect element in a direction parallel to a width direction of the gap.

5. The magnetoresistance effect device according to claim 4, wherein the magnetic material part is arranged to surround at least an outer circumference of the first magnetization free layer.

6. The magnetoresistance effect device according to claim 1, wherein the magnetic material part is arranged to surround at least an outer circumference of the first magnetization free layer.

7. The magnetoresistance effect device according to claim 1, further comprising a magnetic field application mechanism configured to apply a magnetic field having a component in the stacking direction to the magnetoresistance effect element.

\* \* \* \* \*